(12) United States Patent  (10) Patent No.: US 8,754,397 B2
Kastalsky  (45) Date of Patent: Jun. 17, 2014

(54) CNT-BASED ELECTRONIC AND PHOTONIC DEVICES

(75) Inventor: Alexander Kastalsky, Ocean, NJ (US)

(73) Assignee: Nano-Electronic and Photonic Devices and Circuits, LLC, Bridgeport, PA (US)

( * ) Notice: Subject to any disclaimer, the term of this patent is extended or adjusted under 35 U.S.C. 154(b) by 196 days.

(21) Appl. No.: 13/313,554

(22) Filed: Dec. 7, 2011

(65) Prior Publication Data

US 2013/0146836 A1  Jun. 13, 2013

(51) Int. Cl.
*H01L 29/775* (2006.01)
*H01L 33/06* (2010.01)
*H01L 29/76* (2006.01)
*B82Y 99/00* (2011.01)

(52) U.S. Cl.
USPC ........ 257/13; 257/9; 257/10; 257/12; 257/24; 257/29; 438/92; 438/585; 438/586; 438/595

(58) Field of Classification Search
USPC ................ 257/13, 9, 29, 12, 10, 24, E33.005, 257/E29.241, E29.245, 471, 347; 438/585, 438/586, 595, 92
See application file for complete search history.

(56) References Cited

U.S. PATENT DOCUMENTS

| | | | |
|---|---|---|---|
| 6,759,693 B2 * | 7/2004 | Vogeli et al. | 257/183 |
| 7,466,071 B2 * | 12/2008 | Oh et al. | 313/495 |
| 7,714,386 B2 * | 5/2010 | Pesetski et al. | 257/347 |
| 2006/0022191 A1 * | 2/2006 | Bakkers et al. | 257/40 |
| 2006/0261433 A1 * | 11/2006 | Manohara et al. | 257/471 |
| 2007/0108435 A1 * | 5/2007 | Harmon et al. | 257/9 |
| 2008/0283818 A1 * | 11/2008 | Odnoblyudov et al. | 257/13 |
| 2009/0189143 A1 * | 7/2009 | Kastalsky | 257/12 |
| 2010/0102298 A1 * | 4/2010 | Wu | 257/25 |

* cited by examiner

*Primary Examiner* — Lex Malsawma
*Assistant Examiner* — Sheng Zhu
(74) *Attorney, Agent, or Firm* — Baker & Hostetler LLP

(57) ABSTRACT

The carbon nanotube-based electronic and photonic devices are disclosed. The devices are united by the same technology as well as similar elements for their fabrication. The devices consist of the vertically grown semiconductor nanotube having two Schottky barriers at the nanotube ends and one Schottky barrier at the middle of the nanotube. Depending on the Schottky barrier heights and bias arrangements, the disclosed devices can operate either as transistors, CNT MESFET and CNT Hot Electron Transistor, or as a CNT Photon Emitter.

15 Claims, 5 Drawing Sheets

CNT-BASED ELECTRONIC AND PHOTONIC DEVICES

FIELD OF THE INVENTION

The invention relates to carbon nanotube transistors, as well as three-terminal infrared photon emitter.

BACKGROUND OF THE INVENTION

The Carbon Nanotubes (CNT) are viewed to be a new key element for future electronics and photonics. In the semiconductor type CNT, such unique properties as quantization of the electron spectrum, ballistic electron propagation along the tube, current densities as high as $10^9$ A/cm$^2$, existence of the semiconductor phase, possibilities for n- and p-doping with a high carrier mobility, as well as excellent thermal conductance, make the nanotubes a great candidate for future high-speed, high efficiency electronic and photonic devices.

The key element currently used in the electronic circuits is the Si-based transistor. It is important for future nanotube applications to reproduce such an element using CNT technology. Such attempts have been carried out in many research institutions worldwide. The proof-of-concept design, used in all works, where a single nanotube is placed horizontally on the substrate between the contacts, is utilized in essentially all publication on this topic (see e.g. E. Ungersboeck, et al, IEEE Transactions on nanotechnology, V4, p. 533, 2005). The drawback of this method is its impracticality for any scale of circuit integration: placement of multiple identical nanotubes to enhance the output current or to form new circuit elements requires a special micro-manipulator and thus precludes any possibility of IC mass manufacturing. The future success of CNT devices will rely on emergence of a cost efficient manufacturing process that will ensure a high-yield and cost efficiency above the modern transistor technology.

The present invention relates to this technology. It is based on the growth of a nanotube or controllable nanotube array on a metal electrode normally to the electrode plane and then sequential deposition of dielectric and metal layers to produce a solid platform for attachment of a second common contact to all the nanotube tips, thereby forming source and drain electrodes. The transistor gate electrode is made as a third conductive layer sandwiched between the dielectric layers and placed somewhere in the middle of the nanotube length. The CNT transistor structure can be made on a simple glass substrate or any other substrates, including a Si wafer.

Such a technology was presented in the U.S. Pat. No. 7,851,784 by A. Kastalsky, where several semiconductor nanotube array devices and method for their fabrication have been disclosed. Shown in FIG. 1 as a Prior Art, is the nanotube array FET in which the nanotubes are grown normally to the substrate, and the gate electrode 51 is attached to the sidewall of every nanotube 57 in the array through a layer of insulator 54. The key element is the metal layer 51 in the middle of the nanotube length, sandwiched between two insulator layers 52 and 53. During deposition of the first insulator layer 52, a thin layer of insulation material will also be deposited on the nanotube walls, thereby forming a gate insulator layer 54 around each nanotube. It is then followed by deposition of the gate metal layer 51 and the insulator layer 53. After polishing of the insulator layer 53 and exposure of the nanotube tips, the top metal layer 55 (the drain electrode) is deposited to complete the structure. Such a design of the CNT transistor, with the nanotube buried within sequentially deposited insulating and metal layers, allows realization of the planar technology for commercial manufacturing of the CNT-based transistors and circuits.

The described above transistor design is MOSFET-like, i.e. it relies on the gate insulator layer 54 placed between the gate metal layer 51 and the nanotube. To provide a good IC performance, the gate insulator must be rather thin, pin-hole free and spatially uniform within each nanotube and over the entire CNT array. In Si-based ICs, the quality of this layer (typically ~5 nm-thick layer of $SiO_2$ grown at high temperatures by silicon surface oxidation) represents the key element of the device processing. All presented in the literature CNT transistors employ such a MOSFET concept.

The CNT transistors, according to the present invention, rely on different device operational principles and fabrication process. Unlike the MOSFET, they do not contain the gate insulator layer. All three devices disclosed have three Schottky barriers attached to the vertically grown nanotube. Two of them of the same Schottky barrier height are attached to the nanotube ends, thereby forming the contacts to the nanotube, while the third one having different barrier height than previous two is attached directly to the nanotube somewhere in the middle of the nanotube length.

The first CNT device, according to the present invention, represents a MESFET-like transistor (see. e.g. S. Sze, Physics of semiconductor devices, Wiley & Sons, 1969, p. 410), wherein a high Schottky barrier at the middle of the nanotube forms the gate electrode by direct contact to the nanotube, while two contact pads having a low Schottky barrier at the nanotube ends form ohmic contacts and represent source and drain electrodes to the nanotube channel. The MESFET is known to have a high speed of operation and is used in high-frequency amplifiers. As discussed below, the advantages of the nanotube properties and device design introduce additional high-speed benefits. This device is the first object of the present invention.

The second CNT transistor of the present invention relies on a carrier tunneling through the Schottky barrier and ballistic carrier transport along the nanotube, In this case, relatively high energy Schottky barriers are attached to the nanotube ends and free carriers (in the presented design holes) tunnel into the nanotube through the Schottky barrier at the emitter side of the nanotube. If the nanotube length is made shorter than the ballistic mean-free path, the carriers move without losing energy along the entire nanotube directly into the appropriately biased collector electrode and over the collector Schottky barrier. The Schottky barrier at the middle of the nanotube is low and forms an ohmic contact to the base.

The success of operation of this ballistic CNT transistor depends on the ratio of the nanotube length and ballsistic mean-free path, see below. The semiconductor analogue of such a ballistic transistor, belongs to a class of Hot Electron Transistors (HET), see e.g. M. Heiblum et al. Phys. Rev. Lett. 55, 2200 (1985), and relies on the carrier ballistic travelling across the GaAs base in the GaAs/AlGaAs heterostructure. In these publications, some ballistic transport was registered only at low temperatures because of low energy heterostructure barriers. In addition, a tradeoff between the base thickness (which is needed to be very thin, ~10 nm) and the base lateral series resistance (which increases as the base becomes thinner) renders unrealistic the realization of the semiconductor version of this device.

On the other hand, in the SWCNT the room temperature ballistic mean-free path can be as long as 700 nm, see M. Fuhrer et al. Electronic Properties of Molecular Nanostructures, edited by H. Kuzmany, 2001. Therefore, ~600 nm-long nanotube will be sufficient for HET operations. This device is the second object of the present invention. The third device, according to the present invention, has similar device structure and the same Schottky barriers heights as in the above discussed CNT HET. When both Schottky barriers at the nanotube ends are equally biased relatively to the ohmic contact at the middle of the nanotube, carriers tunnel from both nanotube ends into the nanotube body and then, moving ballistically, relax between the quantum levels. There is a probability that the energy loss occurs in this case partially through the process of intra-subband photon emission. Thus, in such an arrangement the device can be used as a Photon Emitter.

The two-electrode intra-band photon emitter has been disclosed by A. Kastalsky in the U.S. Pat. No. 7,728,333, wherein the carrier tunneling into the nanotube occurs only from one contact at the nanotube end. It is followed by movement of the injected carriers ballistically to the opposite, ohmic, contact in the nanotube. Three-terminal design, disclosed in the present invention, with carrier injection from both ends of the nanotube, and therefore with carrier traveling to the ohmic contact within only half of the nanotube length, simplifies the fulfillment of necessary condition of carrier ballistic propagation along the nanotube and thus improves the photon emission efficiency. The intra-band, three-terminal CNT Photon Emitter (CNT PE) represents the third object of the present invention.

DETAILED DESCRIPTION OF THE INVENTION

All disclosed devices have in common the same structure of a nanotube grown vertically on isolating substrate and three Schottky barriers located at the nanotube ends and the nanotube midpoint. That implies that the device processing for all three proposed devices is similar. Depending on application, the barrier heights as well as the device biasing scheme are varied to form different transistor and photon emitter circuits.

It is of a paramount importance for all devices discussed that the nanotubes are semiconducting Single-Walled CNT (SWCNT). Because of CNT outstanding electrical and optical properties, all these devices are expected to have performance superior to their semiconductor counterparts.

The devices, according to the present invention, can include not only a single nanotube but a nanotube array with all the nanotubes connected respectively to the corresponding electrodes. The method of growth of CNT arrays in predetermined position with a subsequent planar deposition of multilayer structure, so that the nanotubes being buried inside the structure, provides the processing suitable for the large scale device integration and mass manufacturing.

The as-grown nanotubes, are predominantly of p-type. This is why all energy band diagrams in FIGS. 3-6 describing the device operations relate to the valence energy band, with degenerate hole statistics and Fermi level positioned above the valence band edge. The conversion into n-type occurs under annealing the nanotubes in vacuum, see V. Derycke et al, Nano Letters 1, p. 453,2001. On the other hand, annealing in the oxygen atmosphere returns the nanotube back to p-type. Another option for p- to n-conversion is annealing of the CNTs in a potassium atmosphere.

To minimize the contact resistance, Pd as a contact metal is preferable for p-type nanotubes, see A. Javey et al, Nano Letters, V. 4. p. 1319, 2004. On the other hand, a high Schottky barrier needed for the gate electrode in the MESFET can be made from Al, while intermediate Schottky barrier height, more appropriate as a tunneling contact in CNT HET and Photon Emitter, comes from Ti layer, see M. H. Yang et al. Appl. Phys. Lett. 87, 253116, 2005.

Figure 1:
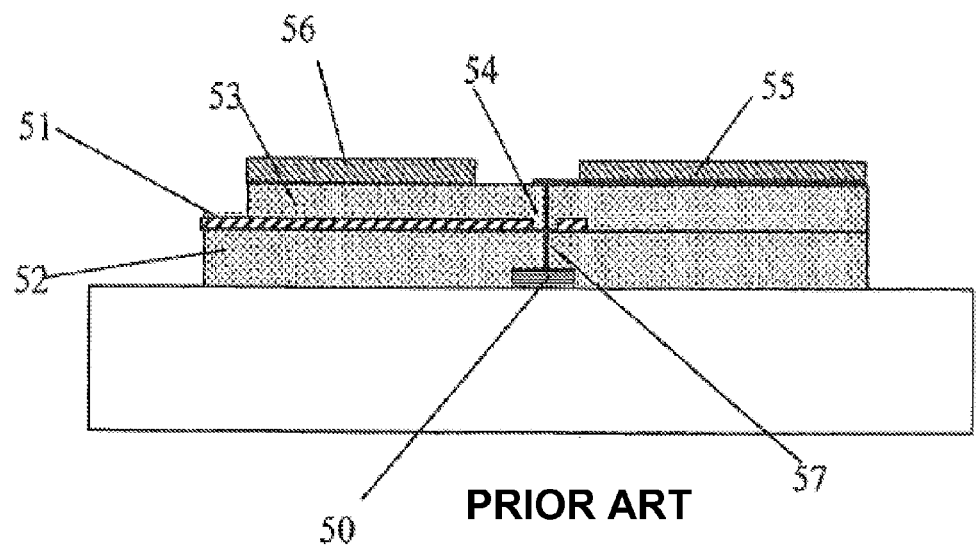
FIG. 1. CNT MOSFET-like structure, Prior Art from the U.S. Pat. No. 7,851,784.
Figure 2:
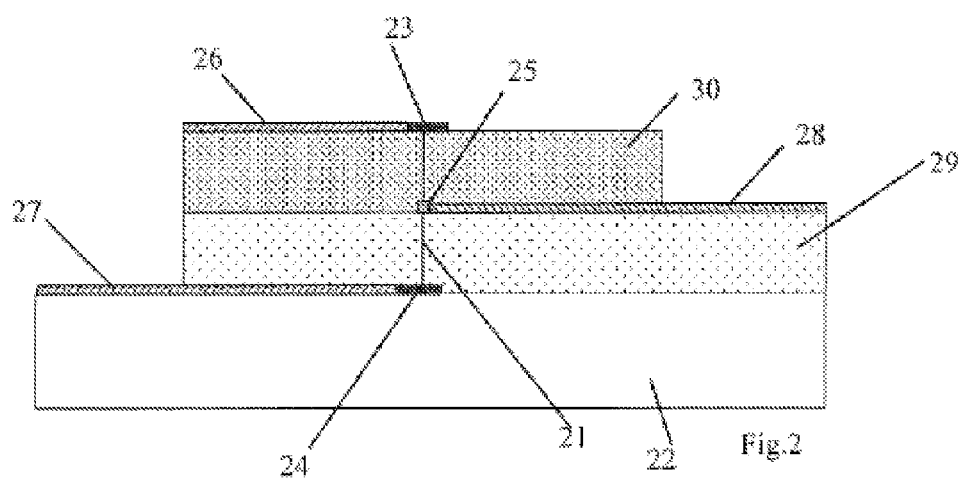
FIG. 2. Cross-section of the disclosed CNT-based devices.
Figure 3:
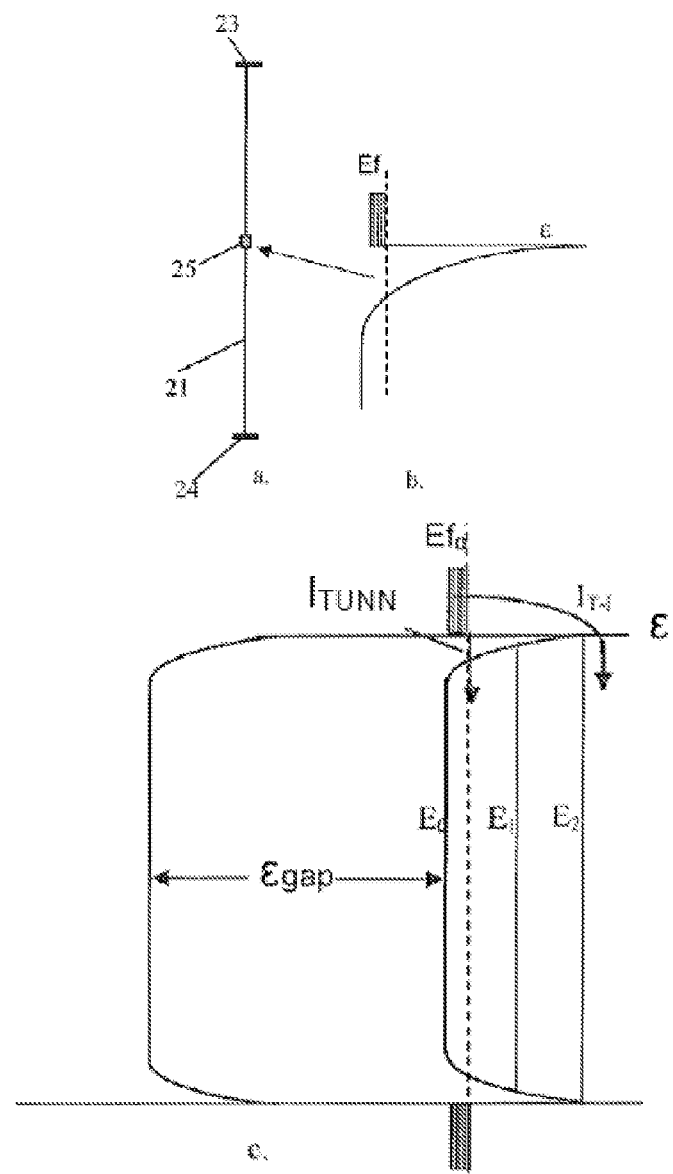
FIG. 3. CNT three-electrode structure with the hole conductivity in the nanotube;
a. Vertical nanotube with three Schottky contacts attached to the ends and the middle of the nanotube; b. Energy band diagram at the Schottky contact attached to the middle of the nanotube; c. Energy band diagram of the p-type nanotube with two Schottky contacts at the nanotube ends.
Figure 4:
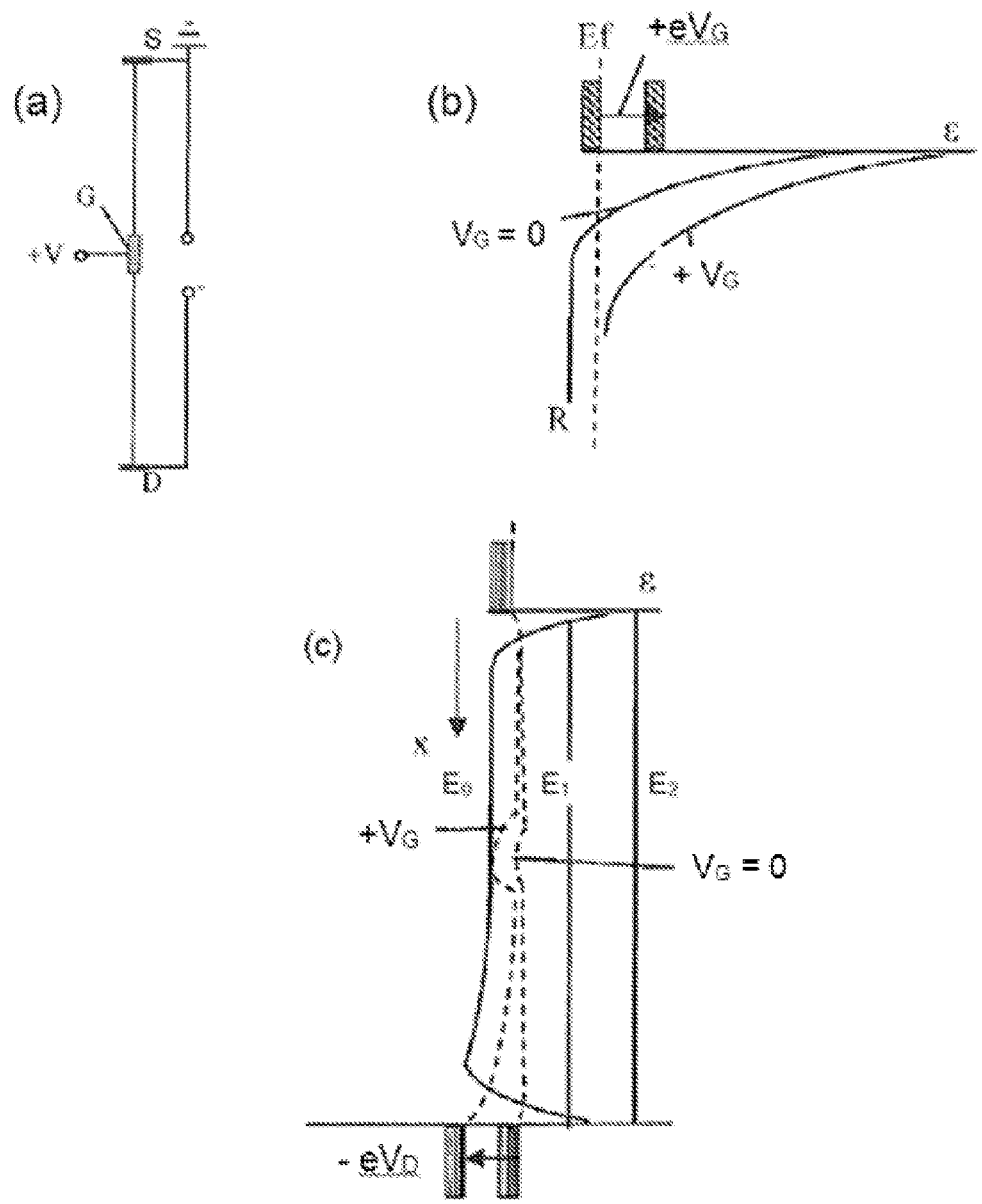
FIG. 4. CNT MESFET with p-type nanotube;
a. Vertical CNT structure with source, drain and gate Schottky barriers;
b. Energy band diagram at the gate contact with two different gate voltages;
c. CNT MESFET energy band diagram for zero and positive gate voltages and the drain voltage applied relative to the source.
Figure 5:
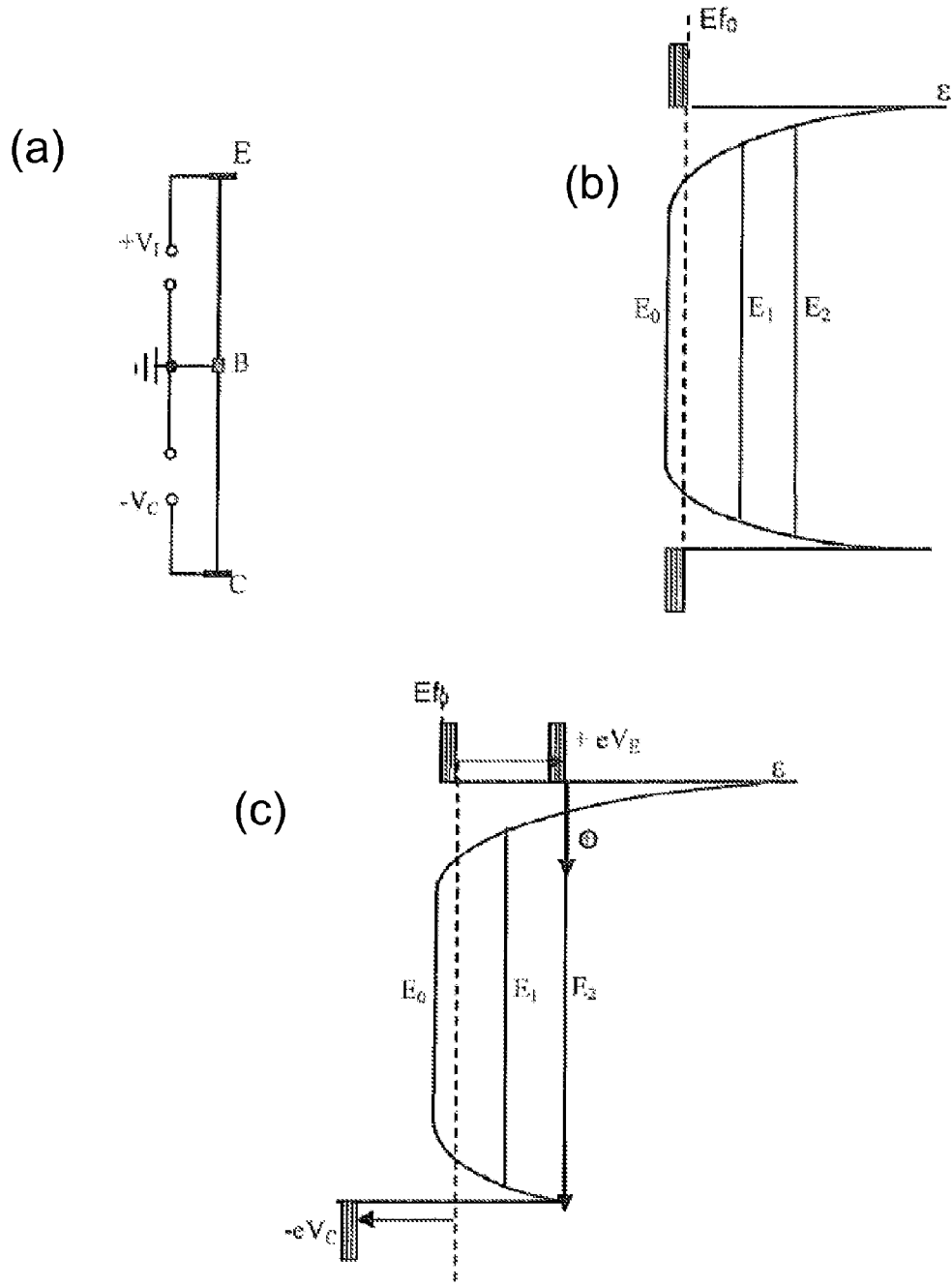
FIG. 5. CNT Hot Electron Transistor with p-type nanotube;
a. Vertical CNT structure with base, emitter and collector contacts;
b. Valence band energy structure in unbiased regime;
c. Energy band diagram of the p-type CNT HET in the regime of operation.

FIG. 2 illustrates the basic elements of the disclosed devices along with the method of their fabrication. A single nanotube 21 is vertically grown on the isolated substrate 22. Three contacts forming Schottky barriers are attached to the nanotube: the top 23 and the bottom 24 contacts to the nanotube ends and the contact 25 in the middle of the nanotube. Three metal electrodes 26, 27 and 28 are connected to the respective nanotube contacts 23, 24 and 25.

The device processing starts from placement of the Schottky contact 24 and the electrode 27 on the substrate which can be a piece of glass, ceramics or Si wafer. It is followed by the growth of the nanotube 21. To activate the nanotube growth, small pads of catalytic material, such as Ni, Cd, Fe and others, are placed on the bottom contact 24 (not shown). Then the dielectric layer 29 reaching the middle of the nanotube length is grown, on which the Schottky contact 25 is deposited around the nanotube to provide a ring-like connection to the nanotube, and the electrode 28 is attached to the Schottky contact 25. It is followed by deposition of the second dielectric layer 30 reaching the top nanotube end. After polishing the second layer 30 to expose the top nanotube tip, the Schottky contact 23 and the top electrode 26 are deposited on the second dielectric 30 to finalize the device processing.

FIG. 3a shows the device basic elements which include the nanotube 21, the midpoint Schottky barrier contact 25 and top 23 and bottom 24 contacts to the nanotube. Depending on the application, the midpoint contact 25 can have maximum Schottky barrier height (as in the CNT MESFET) or minimum Schottky barrier height to form an ohmic contact (as in the CNT HET and CNT PE). FIG. 3b shows the energy band diagram for the midpoint Schottky contact 25.

FIG. 3c shows the entire energy diagram for the p-type nanotube. The Fermi level $Ef_0$ is above the valence band edge indicating the degenerate case of a high hole density, typically in the range of $0.2$-$0.5 \cdot 10^7$ nm$^{-1}$ (which is equivalent to the volume hole density of p $\sim 0.2$-$0.5 \cdot 10^{21}$ cm$^{-3}$ for the 1.5-1 nm nanotube diameter). Such a high density, together with a very high carrier mobility in the SWCNT approaching 10,000 cm$^2$/Vs (see e.g. Y. Zhao et al. in IEEE Electron Device Lett. V30, p. 1078, 2009) yield extremely small nanotube resistance.

Depending on the Schottky barrier height and applied voltages, the contacts to the nanotube can provide either thereto-ionic current $I_{T-I}$ over the barrier or tunneling current $I_{TUNN}$ through the barrier, or both, see FIG. 3c. As follows from the analysis of operation of the disclosed devices, the barriers 23 and 24 can be small to form almost ohmic contacts to the nanotube, as in CNT MESFET, or relatively high, as in CNT HET and CNT PE, wherein the tunneling current component dominates.

1. CNT MESFET

FIG. 4a shows the basic transistor elements, such as source S, drain D and gate G electrodes attached to the p-type nanotube, wherein the source is grounded, and negative voltage $-V_D$ is applied to the drain. To provide a channel depletion in the p-type nanotube voltage $+V_G$ is applied to the gate electrode.

The energy diagram at the gate contact is shown in FIG. 4b for zero voltage $V_G=0$, and positive voltage $+V_G$, measured from the Fermi level $Ef_o$ in the contact metal, as a function of the radial distance R from the nanotube surface toward the nanotube axis. At positive gate voltage $+V_G$ the effective width of the barrier increases indicating the nanotube depletion. In the SWCNT, the material width d in the direction R is one carbon monolayer, i.e. d $\sim 0.3$ nm, and so is the gate voltage induced depletion depth of the nanotube, sufficient to remove holes within the area of gate-nanotube junction. The corresponding pinch-off voltage Vp is determined by the equation, (see e.g. K. Ng, Complete Guide to Semiconductor Devices, IEEE Press, 2002, p 203):

$$Vp = e \cdot p \cdot d^2 / 2 \in$$

where e is the electron charge and $\in$ the dielectric constant of the nanotube. The dependence $Vp \sim d^2$ implies extremely small operational voltages even at a high hole density of $p=5 \times 10^{20}$ cm$^{-3}$.

FIG. 4c shows the valence band energy diagram of the p-type nanotube along the nanotube direction x. Two diagrams are shown. The original one is taken for $V_G=0$ and $V_D=0$. A small dip of the Fermi level in the gate area illustrates a possibility of partial hole depletion even at $V_G=0$. Small Schottky barriers at the source and grain electrodes are considered to be very conductive (ohmic) if the Pd contacts are used for p-type nanotubes. The contact resistance is then essentially controlled by a quantum contact resistance arising due to quantum size effect and ballistic carrier propagation. The conductance of SWCNT is normally controlled by two units of conductance quantum, $2G_0 = 4e2/h$ (6.5 Kohm, see e.g. S. Frank, Science, 280, 1744, 1998). The energy levels $E_0$, $E_1$ and $E_2$ are also related to a strong two-dimensional quantization (quantum size effect). Their presence is of a minor importance for the CNT MESFET operation.

The second energy diagram in FIG. 4c shows the case when a positive gate voltage $+V_G$ and a negative voltage $-V_D$ are applied. A deep drop of the Fermi level in the gate area indicates the effect of channel pinch-off, the energy diagram within the dip being asymmetric due to presence of applied drain voltage $V_D$.

The most important MESFET application is a high-frequency amplification in the microwave circuits. This device is known to be faster than MOSFET. The above described feature of the low channel depletion voltage Vp in CNT MESFET suggests even higher transistor frequency band. The device transconductance $g = dI_D/V_G$ in the disclosed device is extremely high due to low operational voltage $V_G$, and therefore the cut-off frequency, which is proportional to the transconductance g, is expected to be very high. The calculations shows that the frequency cut-off is essentially determined by the time of carrier propagation along the device (see e.g. K. Ng, Complete Guide to Semiconductor Devices, IEEE Press, 2002, p 206). In the present case of ballistic carrier propagation along the nanotube the carrier velocity can be 7-8 times higher than in GaAs, a typical material for MESFET fabrication. This implies that if the total device length is shorter than the ballistic mean-free path of 700 nm, one can expect the CNT MESFET cut-off frequency approaching a terahertz range.

Finally, the array of the nanotubes can be used to increase the output current, with respective gate, source and drain electrodes extending to all the nanotubes in the array.

2. CNT HET

The semiconductor Hot-Electron Transistors attracted a lot of attention in 1980-1990, when the MBE and OMCVD grown heterostructures reach a very high quality, see M. Heiblum, Solid-State Electronics, 24, 343, 1981, and M. Heiblum et al. Phys. Rev. Lett. 55, 2200, 1985. The main and rather stringent condition for realization of this device is ballistic carrier transfer over the base into the collector: the collector current Ic is proportional to the exponential base transfer factor, $Ic \sim \exp(-d/lb)$, where d is the base width and lb is the ballistic mean-free path. The base in the heterostructure case consists of $\sim 10$-$20$ nm wide, heavily doped layer, to both provide the ballistic electron transport and minimize the base lateral resistance. In addition, the parameter lb is known to depend on the carrier energy, decreasing as the energy of emitted carriers increases. This decrease is even more pronounced in typical III-V heterostructures, when the electron energy reaches the energy of satellite valleys, see High-Speed Semiconductor Devices, Ed. By S. Sze, p. 424, 1990. Also, the heterostructure collector barrier is rather small, typically 0.3-0.4 eV, that prevents the device operation at room temperature. Finally, the heterostructure abrupt quantum wells, utilized for the base fabrication, cause undesirable effect of quantum reflections.

Experimentally, the highest transistor gain $\beta \sim 9$ was achieved in the ballistic GaAs/AlGaAs HET at low temperatures with narrowest base yielding the exponential base transfer factor equal to 0.9. However, at high electron energies ($>0.3$ eV) when scattering into satellite L-valeys becomes dominating factor, $\beta$ dropped to 3.

Thus, the realization of semiconductor versions of the HET look rather problematic for the existing heterostructure materials, especially for room temperatures applications. On the other hand, as mentioned above, room temperature mean-free path in the SWCNT was measured to be $\sim 700$ nm, orders of magnitude larger then in the semiconductor heterostructures. This factor makes the CNT HET a realistic candidate for the fastest transistor ever. A fundamental constrain for the semiconductor HET frequency range comes from the lateral base resistance, so that the base-collector capacitance delay is proportional to $L^2$, where L is the characteristic lateral base dimension, see S. Sze, High-Speed Semiconductor Devices, Whiley, 422, 1990. In the CNT HET, the lateral base dimension practically does not exists due to nanotube geometry with $\sim 1$ nm nanotube diameter and 0.3 nm nanotube depth.

Having the appropriate nanotube length of 600 nm one obtains at $V_E$-$V_C$~3 V the ballistic collector-emitter velocity of ~8·10$^7$ cm/sec and travel time of $\tau$<1 ps, yielding the transistor cut-off frequency fc=½$\pi\tau$, approaching the terahertz range.

FIG. 5a shows the nanotube with emitter E, base B and collector C contacts biased to provide tunneling emission of holes into the nanotube and collect them in the collector after their ballistic traveling from emitter to collector. FIG. 5b shows a valence energy band diagram for zero biased case, with two high energy Schottky barriers at the emitter and collector ends of the nanotube. The barriers are sufficiently high to prevent emitter-collector conductance in the unbiased regime. When the voltage $V_E$ is applied to the emitter relative to the grounded base, the tunneling probability for holes at the emitter increases due to thinning of the barriers at the Fermy level $Ef_0$ shifted up by the energy +$eV_E$, and holes are injected into the nanotube.

It is important that carriers have a narrow energy range where they can efficiently tunnel into the quantum level of the nanotube. There are several physical reasons for that. First, above the Fermi level the concentration of holes exponentially decreases according to the Fermi statistics. Second, in the considered case of two-dimensional quantization, the density of state exhibits a sharp peak followed by decays as ~$1/E^{1/2}$ (where E is the energy counted from the quantum level), see e.g. High-Speed Semiconductor Devices, J. Whiley & Sons, p. 98, 1990. On the other hand, below Fermi level the tunneling probability rapidly decreases due to increase of the tunnel barrier thickness. Therefore, the optimum conditions for tunneling occur for the holes at the level $Ef_o$ lifted up by the energy +$eV_E$ to the energy of the quantum level when the carriers are resonantly injected into the nanotube quantum state.

In FIG. 5c, the emitter voltage +$V_E$ is applied to raise the collector Fermi level and bring it in alignment with the second quantum level $E_2$, thereby enabling the hole tunneling into this level. Simultaneously, the collector voltage -$V_C$ is applied to lower the collector barrier below the energy $E_2$ and thus provide a barrier-free, ballistic hole traveling from the emitter, over the collector barrier to the collector contact. A smooth shape of the Schottky barrier decay into the nanotube body will minimize the adverse effect of quantum-mechanical reflections.

Similar biasing approach can be used for the first quantum level $E_1$. However, for room temperature applications, care should be taken to chose a rather thin nanotubes wherein the energy difference $E_1$-$Ef_0$ is large enough to prevent a base-collector thermo-ionic hole emission over negatively biased collector barrier.

3. CNT PE

Figure 6:
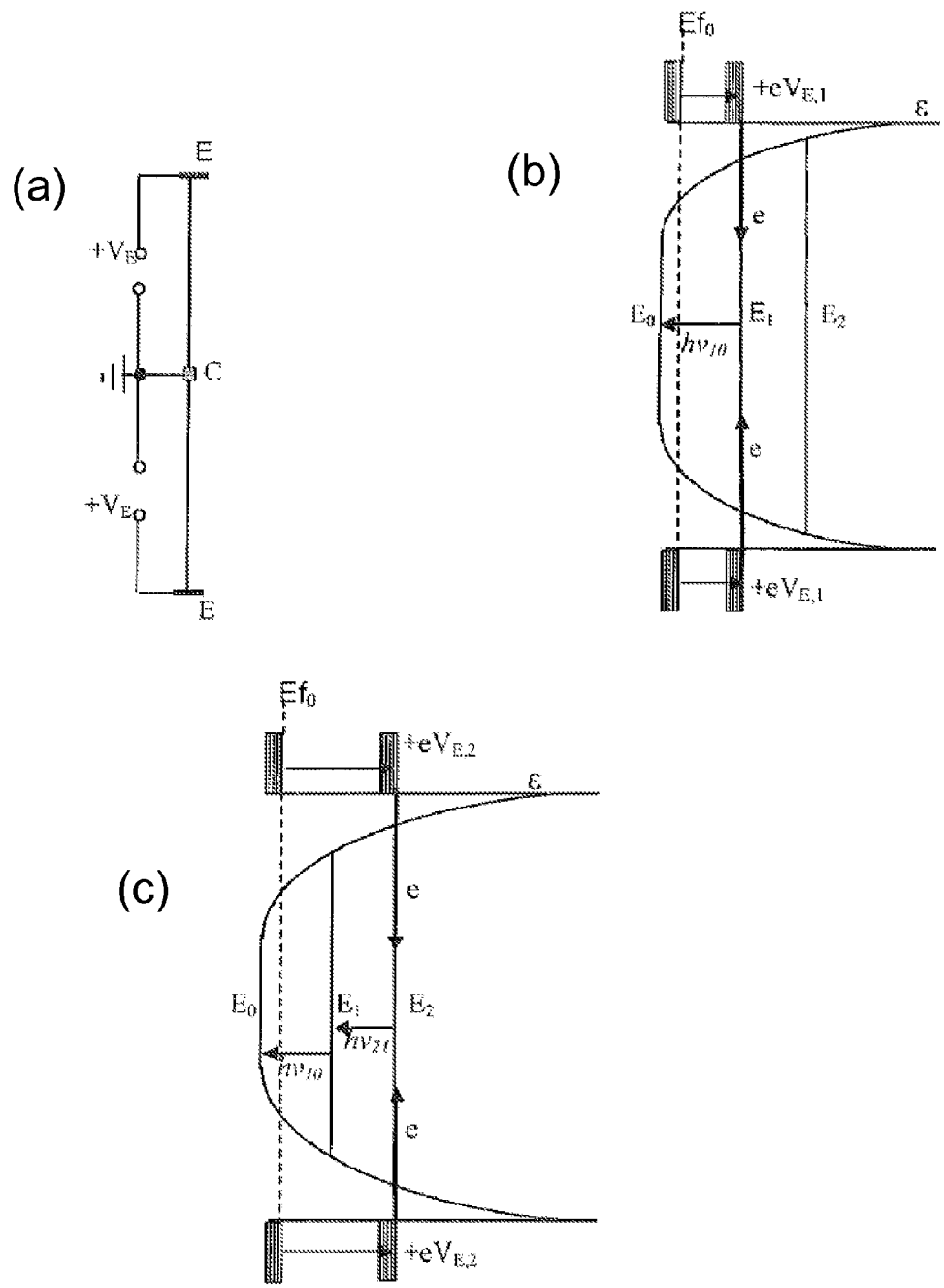
FIG. 6. CNT-based three-electrode Photon Emitter with p-type nanotube;
a. Vertical CNT structure with two emitters contacts at the nanotube ends and collector contact in the middle.
b. Energy band diagram of the Photon Emitter biased to emit photon energy $E_1$-$E_0$;
c. Energy band diagram of the Photon Emitter biased to emit photon energies $E_2$-$E_1$ and $E_1$-$E_0$.

The CNT HET with different circuit arrangement can be used as a ballistic light emitter. FIG. 6 illustrates this concept. FIG. 6a shows the circuit configuration in which two tunneling emitters E attached to the nanotube ends are positively biased relative to the base, so that the Fermi levels in both emitters reach the first quantum level $E_1$, see FIG. 6b. The resonant hole tunneling into this level is followed by the hole ballistic traveling toward the base contact B in the middle of the nanotube. The optically direct inter-subband transitions result in the photon emission with the energy $hv_{10}=E_1-E_0$. The advantage of the disclosed two side injection is twice shorter nanotube length for ballistic hole traveling from the emitter to the base.

It is important that the disclosed radiation comes from a single carrier energy relaxation (unipolar carrier injection), not from recombination of e-h pairs. The latter process normally results in creation of excitons with low light emission efficiency ("dark excitons"), see e.g. Y. Z. Ma et al. Journ. Chem. Phys. V 129, p. 3368, 2004; P. Avouris Nature Photonics 2, 341, 2008. In the disclosed case of carrier tunneling injection into the high-energy states in the nanotube and subsequent inter-subband energy relaxation of only one type of carriers (holes in the presented cases) there is no process of exciton formation, and one can expect much higher photon emission efficiency.

FIG. 6c shows the emitter biasing relative to the base when both emitters reach the energy of the second energy level $E_2$. The resultant photon emission will be determined by two photons with the energies $hv_{21}=E_2-E_1$ and $hv_{10}=E_1-E_0$. That implies multiple photon, voltage controlled, light emission. In both presented cases, use of nanotube arrays instead a single nanotube will proportionally increase the total light output.

Since the light emission in the intra-level recombination is oriented parallel to the nanotube direction, see U.S. Pat. No. 7,728,333, it is preferable to replace the top final metal layer with a transparent conductive layer, such as ITO. This layer will be grown after deposition of small Schottky barrier pad on top of the nanotube.

Thus, according to the present invention, three devices having different principles of operation are disclosed. These devices are united by the same technology as well as similar elements for their fabrication. The devices consist of the vertically grown semiconductor nanotube having two Schottky barriers at the nanotube ends and one Schottky barrier at the middle of the nanotube. Depending on the Schottky barrier heights and bias arrangements, the disclosed devices can operate either as transistors, CNT MESFET and CNT HET, or as a photon emitter, CNT PE. The proposed transistors are expected to be the fastest semiconductor devices due to unique properties of the nanotubes. Simple device manufacturing based on a vertical nanotube growth in controllable positions on the substrate followed by sequential dielectric and metal layer depositions, make these devices suitable for cost-effective mass production.

The invention claimed is:
1. A CNT-based, three-electrode device comprising the following elements:
a first Schottky barrier metal pad superposed on a dielectric substrate, with a first metal layer attached to said first Schottky barrier metal pad to form a first device electrode;
a semiconductor p- or n-type nanotube, having proximal and distal ends, positioned normal to said dielectric substrate, said proximal end of the nanotube attached to and in electrical communication with said first Schottky barrier metal pad;
a first dielectric layer covering said semiconductor type nanotube and extending up to the middle of the nanotube;
a second Schottky barrier metal pad positioned on said first dielectric layer and attached to, and in electric communication with, the middle of said semiconductor type nanotube, with a second metal layer connected to said second Schottky barrier metal pad to form a second device electrode;
a second dielectric layer positioned on top of said first dielectric layer and covering the full length of said nanotube;
a third Schottky barrier metal pad positioned on, and in electrical communication with the distal end said nano- tube, with a third metal layer electrically connected to said third Schottky barrier metal pad to form a third device electrode.

2. The CNT-based three-electrode device of claim 1, wherein said semiconductor p- or n-type nanotube is replaced with an array of the semiconductor p- or n-type nanotubes in electrical communication with said first Schottky barrier metal pads, positioned in predetermined positions on said dielectric substrate and connected to, and in electrical communication with, the first metal layer common to all nanotubes in the array, thereby forming the first electrode of the transistor array.

3. A CNT MESFET comprising a device of claim 1, wherein said first and third Schottky barrier metal pads are made from material with a low Schottky barrier, thereby forming ohmic contacts to the proximal and distal ends of said semiconductor nanotube, while said second Schottky barrier metal pad in the middle of the nanotube is made of the material with a high Schottky barrier thereby forming the gate electrode.

4. The CNT MESFET of claim 3, wherein said semiconductor type nanotube is p-type, while said first and third Schottky barrier metal pads are made from Pd and said second Schottky barrier metal pad is made from Al.

5. A CNT MESFET comprising a device of claim 2, wherein said first and third Schottky barrier metal pads are made from material with a low Schottky barrier, thereby forming ohmic contacts to the proximal and distal ends of said semiconductor nanotube, while said second Schottky barrier metal pad in the middle of the nanotube is made of the material with a high Schottky barrier thereby forming the gate electrode.

6. A CNT Hot Electron Transistor comprising a device of claim 1, wherein said first and third Schottky barrier metal pads are made from the material with a high Schottky barrier, while said second Schottky barrier metal pad is made from material with a low Schottky barrier, thereby forming ohmic contact at the second electrode to the nanotube, the nanotube being shorter than the mean-free pass for ballistic carrier movement along the nanotube, so that at the appropriate biasing of emitter and collector electrodes at the nanotube ends relative to the second electrode at the nanotube midpoint the carriers tunnel into the nanotube through the emitter Schottky barrier, travel ballistically along the nanotube, and after moving over the collector Schottky barrier, reach the collector electrode.

7. The CNT Hot Electron Transistor of claim 6 where the nanotube length is shorter than 700 nm.

8. The CNT Hot Electron Transistor of claim 6, wherein said semiconductor type nanotube is p-type, said first and third Schottky barrier metal pads are made from Ti, and said second Schottky barrier metal pad is made from Pd.

9. A CNT Hot Electron Transistor comprising a device of claim 2, wherein each nanotube length is shorter than 700 nm.

10. A CNT Photon Emitter comprising a device of claim 1, wherein said first and third Schottky barrier metal pads are made from a material with a high Schottky barrier and form two tunneling emitters at the nanotube ends, while said second Schottky barrier metal pad is made from a material with a low Schottky barrier, thereby forming ohmic contact at the second electrode, the nanotube being shorter than the double mean-free pass length for ballistic carrier movement along the nanotube, so that the carriers injected from both emitters and moving ballistically along the half of the nanotube toward the second electrode at the nanotube midpoint, emit photons with the energies determined by both the energies of quantum levels in the nanotube energy spectrum and biasing voltage of the emitter electrodes relative to the second electrode.

11. The CNT Photon Emitter of claim 10, wherein the total nanotube length is shorter than 1400 nm.

12. The CNT Photon Emitter of claim 11, wherein said semiconductor type nanotube is p-type, while said first and third Schottky barrier metal pads of the emitters are made from Ti, and said second Schottky barrier metal pad is made from Pd.

13. A CNT Photon Emitter comprising a device of claim 10 wherein the total nanotube length is shorter than 1400 nm.

14. The CNT Photon Emitter of claim 10, wherein said third metal layer is made from conductive and optically transparent material.

15. The CNT Photon Emitter of claim 14, wherein said conductive and optically transparent material is indium tin oxide (ITO).

* * * * *